(12) United States Patent
Zhang et al.

(10) Patent No.: US 11,239,213 B2
(45) Date of Patent: Feb. 1, 2022

(54) IN-SITU CURING OF COLOR CONVERSION LAYER IN RECESS

(71) Applicant: Applied Materials Inc., Santa Clara, CA (US)

(72) Inventors: Daihua Zhang, Los Altos, CA (US); Yingdong Luo, San Jose, CA (US); Mingwei Zhu, San Jose, CA (US); Hou T. Ng, Campbell, CA (US); Sivapackia Ganapathiappan, Los Altos, CA (US); Nag B. Patibandla, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/416,098

(22) Filed: May 17, 2019

(65) Prior Publication Data
US 2020/0365566 A1   Nov. 19, 2020

(51) Int. Cl.
*H01L 33/50* (2010.01)
*H01L 25/075* (2006.01)
(Continued)

(52) U.S. Cl.
CPC ...... *H01L 25/0753* (2013.01); *H01L 33/0075* (2013.01); *H01L 33/32* (2013.01);
(Continued)

(58) Field of Classification Search
CPC ... H01L 33/0095; H01L 33/50; H01L 33/501; H01L 33/502; H01L 33/504; H01L 33/505; H01L 33/507; H01L 33/508; H01L 33/44
See application file for complete search history.

(56) References Cited

U.S. PATENT DOCUMENTS 6,635,363 B1   10/2003   Duclos et al.
8,227,269 B2   7/2012   Chen et al.
(Continued)

FOREIGN PATENT DOCUMENTS

CN   109638138 A  *  4/2019
CN   108257949       2/2020
(Continued)

OTHER PUBLICATIONS

PCT International Search Report and Written Opinion in International Appln. PCT/US2020/033054, dated Aug. 28, 2020, 11 pages.
(Continued)

*Primary Examiner* — Shih Tsun A Chou
*Assistant Examiner* — Peter M Albrecht
(74) *Attorney, Agent, or Firm* — Fish & Richardson P.C.

(57) ABSTRACT

A method of fabricating a multi-color display includes dispensing a photo-curable fluid over a display having an array of LEDs disposed below a cover layer. The cover has an outer surface with a plurality of recesses, and the photo-curable fluid fills the recesses. The photo-curable fluid includes a color conversion agent. A plurality of LEDs in the array are activated to illuminate and cure the photo-curable fluid to form a color conversion layer in the recesses over the activated LEDs. This layer will convert light from these LEDs to light of a first color. An uncured remainder of the photo-curable fluid is removed. Then the process is repeated with a different photo-curable fluid having a different color conversion agent and a different plurality of LEDs. This forms a second color conversion layer in different plurality of recesses to convert light from these LEDs to light of a second color.

17 Claims, 5 Drawing Sheets

(51) Int. Cl.
*H01L 33/00* (2010.01)
*H01L 33/32* (2010.01)

(52) U.S. Cl.
CPC .... *H01L 33/504* (2013.01); *H01L 2933/0033* (2013.01); *H01L 2933/0041* (2013.01); *H01L 2933/0058* (2013.01)

(56) References Cited

U.S. PATENT DOCUMENTS

| | | | |
|---|---|---|---|
| 8,323,748 | B2 | 12/2012 | Ling |
| 8,425,065 | B2 | 4/2013 | Ravillisetty et al. |
| 9,111,464 | B2 | 8/2015 | Bibl et al. |
| 10,048,530 | B1 | 8/2018 | Kim et al. |
| 11,094,530 | B2 | 8/2021 | Zhang |
| 2006/0105483 | A1 | 5/2006 | Leatherdale et al. |
| 2008/0278068 | A1 | 11/2008 | Huang et al. |
| 2010/0117106 | A1 | 5/2010 | Trottier |
| 2010/0295077 | A1 | 12/2010 | Melman |
| 2012/0267997 | A1 | 10/2012 | Kijima et al. |
| 2012/0285379 | A1 | 11/2012 | Hirakata et al. |
| 2015/0255505 | A1 | 9/2015 | Jeoung et al. |
| 2017/0244010 | A1* | 8/2017 | Kim ................ H01L 33/58 |
| 2018/0074240 | A1* | 3/2018 | Bonar ............... H01L 33/507 |
| 2018/0156951 | A1 | 6/2018 | Baek et al. |
| 2018/0277525 | A1 | 9/2018 | Cok et al. |
| 2018/0308420 | A1* | 10/2018 | Shin ................. H04N 5/374 |
| 2018/0366622 | A1* | 12/2018 | Ulmer .............. B41J 2/2103 |
| 2019/0107755 | A1 | 4/2019 | Chen |
| 2020/0088920 | A1 | 3/2020 | Sakaino et al. |
| 2020/0152841 | A1* | 5/2020 | Han .................. H01L 33/505 |
| 2020/0365774 | A1 | 11/2020 | Zhang et al. |

FOREIGN PATENT DOCUMENTS

| | | | |
|---|---|---|---|
| JP | 2008159756 A | * 7/2008 | |
| JP | 2010267900 A | * 11/2010 | ............ H01L 24/97 |
| TW | 201904105 | 1/2019 | |
| TW | 201911565 | 3/2019 | |

OTHER PUBLICATIONS

TW Office Action in Taiwanese Appln. No. 109114707 dated Jan. 13, 2021, 11 pages (with English search report).
Office Action in Taiwanese Appln. No. 109114707, dated Jun. 3, 2021, 15 pages (with English Search Report).

* cited by examiner

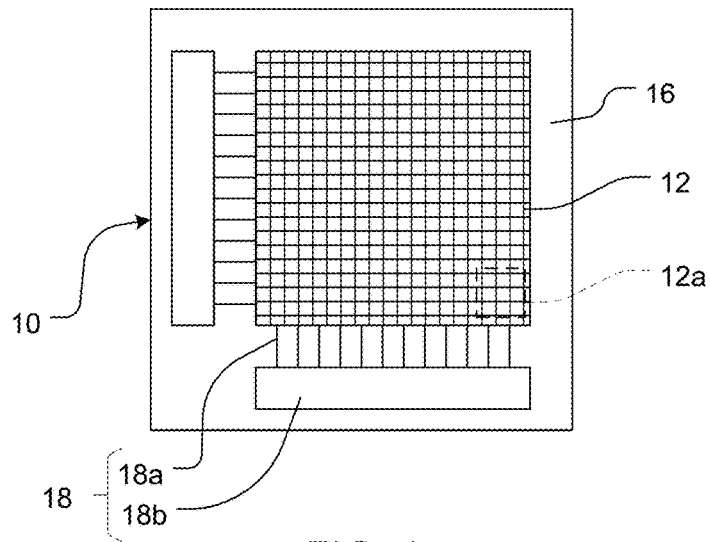
FIG. 1
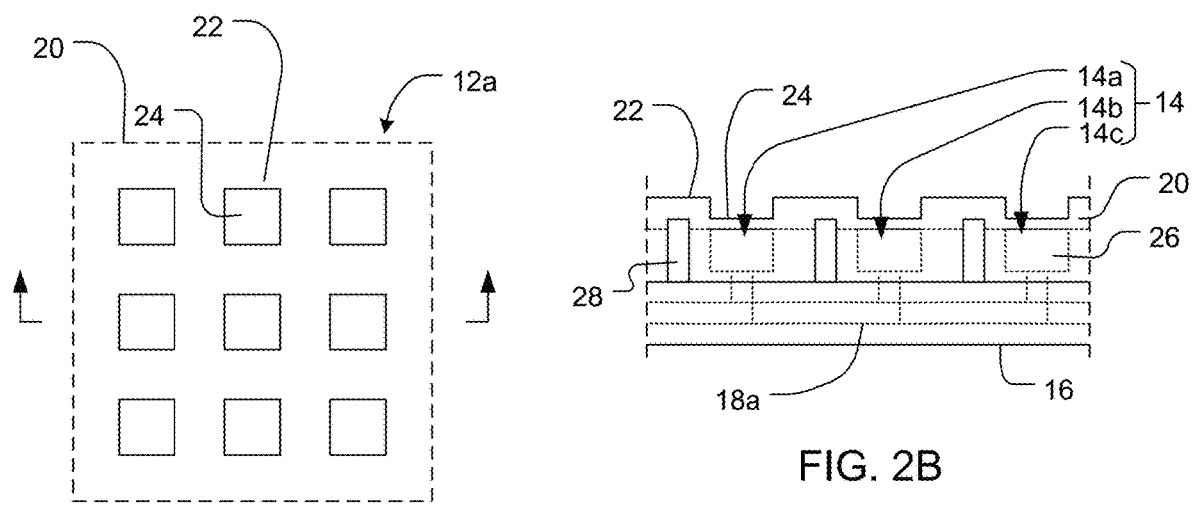
FIG. 2A
FIG. 2B

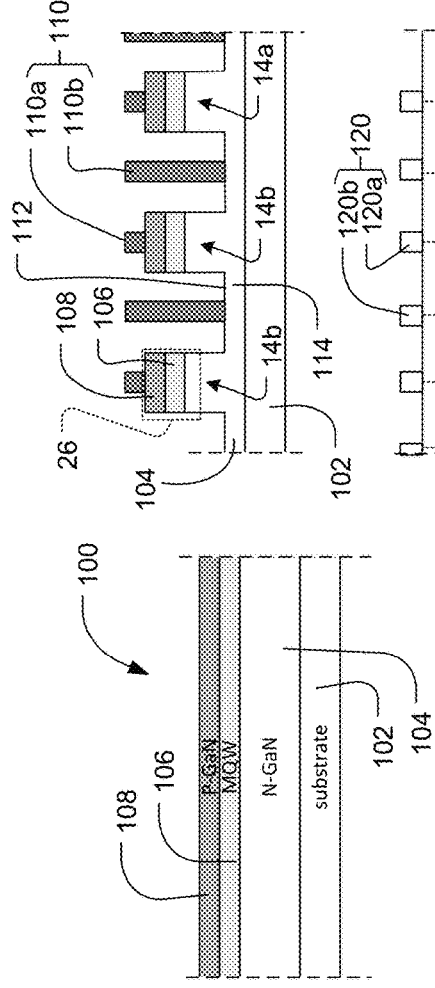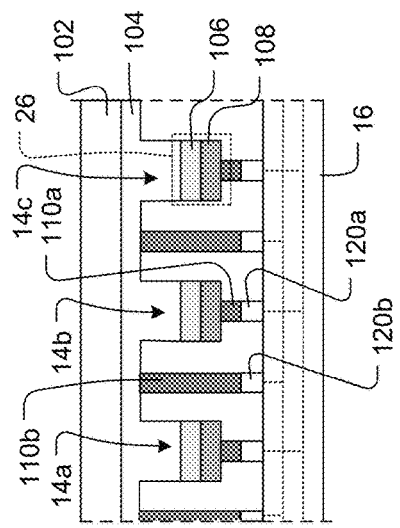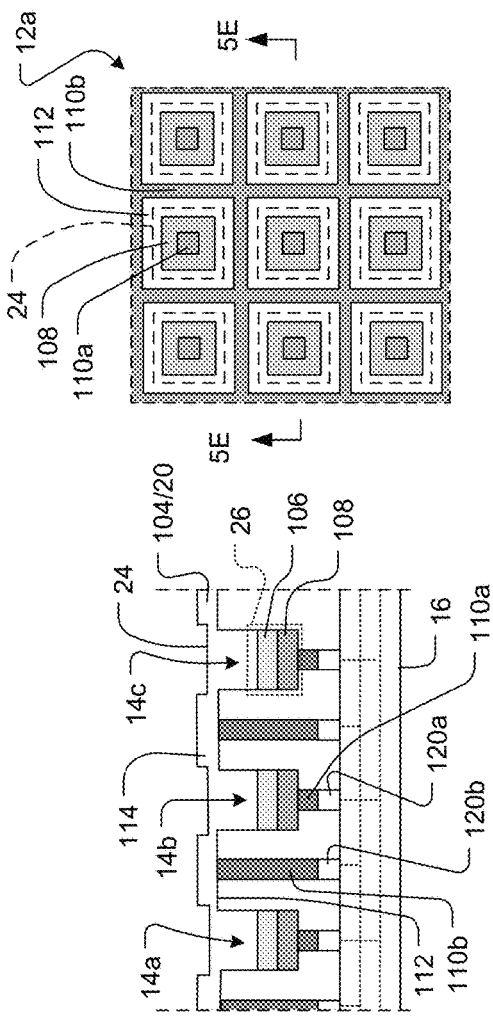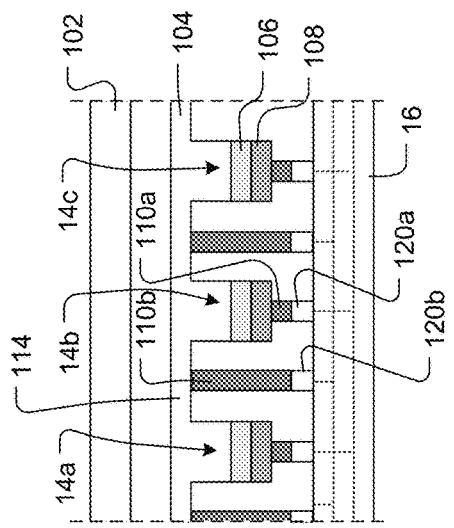

IN-SITU CURING OF COLOR CONVERSION LAYER IN RECESS

TECHNICAL FIELD

This disclosure generally relates to fabrication of micro-LED displays.

BACKGROUND

A light emitting diode (LED) panel uses an array of LEDs, with individual LEDs providing the individually controllable pixel elements. Such an LED panel can be used for a computer, touch panel device, personal digital assistant (PDA), cell phone, television monitor, and the like.

An LED panel that uses micron-scale LEDs based on III-V semiconductor technology (also called micro-LEDs) would have a variety of advantages as compared to OLEDs, e.g., higher energy efficiency, brightness, and lifetime, as well as fewer material layers in the display stack which can simplify manufacturing. However, there are challenges to fabrication of micro-LED panels. Micro-LEDs having different color emission (e.g., red, green and blue pixels) need to be fabricated on different substrates through separate processes. Integration of the multiple colors of micro-LED devices onto a single panel requires a pick-and-place step to transfer the micro-LED devices from their original donor substrates to a destination substrate. This often involves modification of the LED structure or fabrication process, such as introducing sacrificial layers to ease die release. In addition, stringent requirements on placement accuracy (e.g., less than 1 um) limit either the throughput, the final yield, or both.

An alternative approach to bypass the pick-and-place step is to selectively deposit color conversion agents (e.g., quantum dots, nanostructures, fluorescent materials or organic substances) at specific pixel locations on a substrate fabricated with monochrome LEDs. The monochrome LEDs can generate relatively short wavelength light, e.g., purple or blue light, and the color conversion agents can convert this short wavelength light into longer wavelength light, e.g., red or green light for red or green pixels. The selective deposition of the color conversion agents can be performed using high-resolution shadow masks or controllable inkjet or aerosol jet printing.

SUMMARY

In one aspect, a method of fabricating a multi-color display includes dispensing a first photo-curable fluid over a display having an array of light emitting diodes disposed below a cover layer having an outer surface with a plurality of recesses such that the first photo-curable fluid fills the recesses. Each light emitting diode has a corresponding recess, the light emitting diodes are electrically integrated with backplane circuitry of the backplane, and the first photo-curable fluid includes a first color conversion agent. A first plurality of light emitting diodes in the array of light emitting diodes are activated to illuminate and cure the first photo-curable fluid to form a first color conversion layer in a first plurality of recesses over the first plurality of light emitting diodes to convert light from the first plurality of light emitting diodes to light of a first color. An uncured remainder of the first photo-curable fluid is removed. Thereafter a second photo-curable fluid is dispensed over the display such that the second photo-curable fluid fills recesses of the plurality of recess that are not filled by the first color conversion layer. The second photo-curable fluid including a second color conversion agent. A second plurality of light emitting diodes in the array of light emitting diodes are activated to illuminate and cure the second photo-curable fluid to form a second color conversion layer in a second plurality of recesses over the second plurality of light emitting diodes to convert light from the second plurality of light emitting diodes to light of a different second color. An uncured remainder of the second photo-curable fluid is removed.

Implementations may include one or more of the following features.

A third photo-curable fluid may be dispensed over the display such that the fluid fills recesses of the plurality of recess that are not filled by the first color conversion layer and the second color conversion layer. The third photo-curable fluid may include a third color conversion agent. A third plurality of light emitting diodes in the array of light emitting diodes may be activated to illuminate and cure the third photo-curable fluid to form a third color conversion layer in a third plurality of recesses over the third plurality of light emitting diodes to convert light from the third plurality of light emitting diodes to light of a different third color. An uncured remainder of the third photo-curable fluid may be removed.

The first color, second color and third color may be selected from blue, green and red. Light emitting diodes of the array of light emitting diodes may be configured to generate ultraviolet light. The array of light emitting diodes may include a third plurality of light emitting diodes, and no color conversion layer need be formed over the third plurality of light emitting diodes.

Activating the first plurality of light emitting diodes may cure the first photo-curable fluid to form the first color conversion layer with a top surface below the outer surface of the layer. Activating the first plurality of light emitting diodes may cure the first photo-curable fluid to form the first color conversion layer such that the first color conversion layer overflows the recess.

Each of the light emitting diodes may include a diode structure including a first semiconductor layer having a first doping, a second semiconductor layer having a second opposite doping, and an active layer between the first semiconductor layer and the second semiconductor layer. The light emitting diodes may be micro-LEDs. The first semiconductor layer may be an n-GaN layer, and the second semiconductor layer may be a p-GaN layer. The second semiconductor layer may provide the top layer. The plurality of recesses may be formed in a surface of the second semiconductor layer farther from the active layer.

A plurality of optical isolation structures may be formed on the backplane between adjacent light emitting diodes of the array of light emitting diodes and below the cover layer. During activation of the first plurality of light emitting diodes, the optical isolation structures may block illumination from the first plurality of light emitting diodes from reaching the second plurality of light emitting diodes. The optical isolation structures may be conductive. The optical isolation structures may be conductive pads to connect the light emitting diodes to the backplane circuitry.

At least one of the first photo-curable fluid and the second photo-curable fluid may include a solvent. The solvent may be evaporated An ultraviolet blocking layer may be formed over the array of light emitting diodes.

In another aspect, a multi-color display includes a backplane having backplane circuitry, an array of micro-LEDs electrically integrated with backplane circuitry of the backplane, a cover layer covering and spanning the array of micro-LEDs, a plurality of recesses in an outer surface of the cover layer on a side of the cover layer farther from the diode structures, each recess of the plurality of recesses positioned over a corresponding micro-LED from the plurality of micro-LEDs, a first color conversion layer in each recess over a first plurality of light emitting diodes to convert the illumination from the first plurality of light emitting diodes to light of a first color, and a second color conversion layer in each recess over a second plurality of light emitting diodes to convert the illumination from the second plurality of light emitting diodes to light of a different second color. The micro-LEDs of the array include diode structures configured to generate illumination of the same wavelength range.

Implementations may include one or more of the following features.

Each of the diode structures may include a first semiconductor layer having a first doping, a second semiconductor layer having a second opposite doping, and an active layer between the first semiconductor layer and the second semiconductor layer. The second semiconductor layer may provide the cover layer.

A plurality of optical isolation structures may be formed on the backplane between adjacent light emitting diodes of the array of light emitting diodes below the cover layer. The first color conversion layer may have a top surface below the outer surface of the cover layer. The first color conversion layer may overflow the recess. An ultraviolet blocking layer may be disposed over the cover layer.

Implementations can optionally provide (and are not limited to) one or more of the following advantages.

The processing steps (coating, in-situ curing, and rinsing) support large format and high-throughput operation. Thus, color conversion agents can be selectively formed over an array of micro-LEDs with higher yield and throughput. This may permit multi-color micro-LED displays to be fabricated in a commercially viable manner. Flexible and/or stretchable displays can be fabricated more easily. In-situ curing can automatically ensure alignment accuracy. Providing the color conversion layers in the recesses can automatically align the layers with the diode structures.

The host polymer can serve as a passivation layer for die protection. It is also possible for the host polymer to provide other functions, e.g., an optical functionality, when properly mixed with functional ingredients.

Other aspects, features, and advantages will be apparent from the description and drawings, and from the claims.

A variety of implementations are described below. It is contemplated that elements and features of one implementation may be beneficially incorporated in other implementations without further recitation.

BRIEF DESCRIPTION OF THE DRAWINGS

FIG. 1 is a schematic top view of a micro-LED array that has already been integrated with a backplane.

FIG. 2A is a schematic top view of a portion of a micro-LED array.

FIG. 2B is a schematic cross-sectional view of the portion of the micro-LED array from FIG. 2A.

FIGS. 5A-5E illustrate a method of fabricating a micro-LED array on a backplane.

FIG. 6 is a schematic bottom view of a portion of a micro-LED array.

Like reference symbols in the various drawings indicate like elements.

DETAILED DESCRIPTION

Figure 3A:
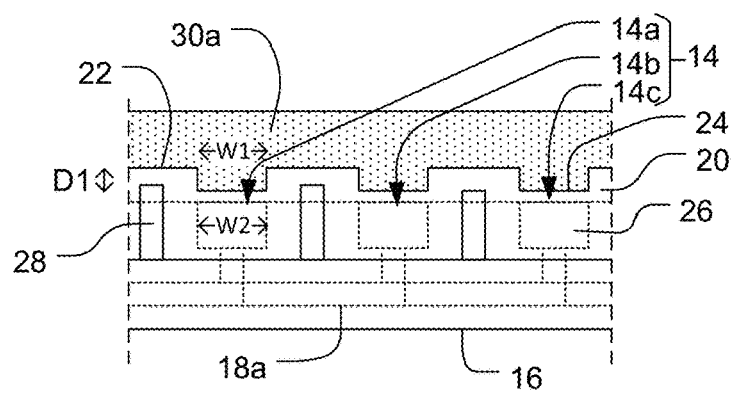
FIGS. 3A-3H illustrate a method of selectively forming color conversion agent (CCA) layers over a micro-LED array.

As noted above, selective deposition of color conversion agents can be performed using use high-resolution shadow masks or controllable inkjet or aerosol jet printing. Unfortunately, shadow masks are prone to problems with alignment accuracy and scalability, whereas inkjet and aerosol jet techniques suffer from resolution (inkjet), accuracy (inkjet) and throughput (aerosol jet) problems. In order to manufacture micro-LED displays, new techniques are needed to precisely and cost-effectively provide color conversion agents for different colors onto different pixels on a substrate, such as a large area substrate or flexible substrate.

A technique that may address these problems is to coat a layer of photo-curable fluid containing a color conversion agent (CCA) for a first color onto a layer having recesses disposed over an array of monochrome light sources. Selected pixels are turned on to trigger in-situ polymerization and immobilize the CCA in the vicinity of the selected pixels. The uncured fluid over the non-selected pixels can be removed, and then the same process can be repeated with CCAs for different colors until all recesses that correspond to pixels are covered with CCAs of the desired colors. This technique may overcome the challenges in alignment accuracy, throughput and scalability.

FIG. 1 illustrates a micro-LED display 10 that includes an array 12 of individual micro-LEDs 14 (see FIGS. 2A and 2B) disposed on a backplane 16. The micro-LEDs 14 are already integrated with backplane circuitry 18 so that each micro-LED 14 can be individually addressed. For example, the backplane circuitry 18 can include a TFT active matrix array with a thin-film transistor and a storage capacitor (not illustrated) for each micro-LED, column address and row address lines 18a, column and row drivers 18b, etc., to drive the micro-LEDs 14. The backplane 16 can be fabricated using conventional CMOS processes.

FIGS. 2A and 2B illustrate a portion 12a of the micro-LED array 12. The micro-LED array 12 has a top layer 20 that extends across multiple micro-LEDs 14. For example, the top layer 20 can extend across the entire micro-LED array 12.

The top layer 20 has an upper surface 22. Each micro-LED 14 includes a diode structure 26 formed below the top surface 22. In some implementations, the top layer 22 forms a part of each diode structure 26. For example, the top layer 22 can be a doped semiconductor layer, e.g., the n-doped semiconductor layer, such as an n-doped gallium nitride (n-GaN) layer, in the diode structure 26.

A plurality of recesses 24 are formed in the top surface 22, with each micro-LED 14 positioned below a respective one of the recesses 24. The recesses 24 extend partially, but not entirely, through the top layer 20. As shown in FIG. 2A, the recesses 24 can be rectangular, and can be arranged in a rectangular array. However, other shapes for the recess, e.g., circular or hexagonal, are possible, and other array geometries, e.g., hexagonal lattice, are possible.

The diode structures 26 can have a width W2 of about 4 to 100 µm, e.g., 4 to 50 µm, e.g., 4 to 10 µm. The diode structures can have a pitch of about 6 to 200 µm, e.g., 6 to 100 µm, e.g., 6 to 20 µm.

The recesses 24 can have a lateral width W1 that is 75% to 150% of the width W2 of the diode structure 26. In some implementations, e.g., as shown in FIGS. 5A-5E and 6, the recesses 24 are wider than the diode structure 26. For example, the recesses 24 can be wider than the diode structure by about 1 to 50 µm. The wider recess 24 helps ensure that all of the light emitted by a micro-LED 14 is converted by a color conversion layer 40. The recesses 24 can have a depth D1 of about 3 to 20 µm.

All of the micro-LEDs 14, e.g., the diode structures 26, are fabricated with the same structure so as to generate the same wavelength range (this can be termed "monochrome" micro-LEDs). For example, the micro-LEDs 14 can generate light in the ultraviolet (UV), e.g., the near ultraviolet, range. For example, the micro-LEDs 14 can generate light in a range of 365 to 405 nm. As another example, the micro-LEDs 14 can generate light in the violet or blue range. The micro-LEDs can generate light having a spectral bandwidth of 20 to 60 nm.

FIG. 2B illustrates a portion of the micro-LED array that can provide a single pixel. Assuming the micro-LED display is a three-color display, each pixel includes three sub-pixels, one for each color, e.g., one each for the blue, green and red color channels. As such, the pixel can include three micro-LEDs 14a, 14b, 14c. For example, the first micro-LED 14a can correspond to a blue subpixel, the second micro-LED 14b can correspond to a green subpixel, and the third micro-LED 14c can correspond to a red subpixel. However, the techniques discussed below are applicable to micro-LED displays that use a larger number of colors, e.g., four or more colors. In this case, each pixel can including four or more micro-LEDs, with each micro-LED corresponding to a respective color. In addition, the techniques discussed below are applicable to micro-LED displays that use just two colors.

In general, the monochrome micro-LEDs 14 can generate light in a wavelength range having a peak with a wavelength no greater than the wavelength of the highest-frequency color intended for the display, e.g., purple or blue light. The color conversion agents can convert this short wavelength light into longer wavelength light, e.g., red or green light for red or green subpixels. If the micro-LEDs generate UV light, then color conversion agents can be used to convert the UV light into blue light for the blue subpixels.

Isolation structures 28 can be formed below the top layer 20 between neighboring micro-LEDs 14. The isolation structure 28 can be provided by a portion of the micro-LED 14, e.g., electrical contacts, as discussed further below. The isolation structures 28 provide for optical isolation to help localize polymerization and reduce optical crosstalk during the in-situ polymerization discussed below. A possible process for back-plane integration and formation of the isolation structures is discussed in more detail below. The isolation structures 28 can extend partially into the top layer 20.

FIGS. 3A-3G illustrate a method of selectively forming color conversion agent (CCA) layers over a micro-LED array. Initially, as shown in FIG. 3A, a first photo-curable fluid 30a is deposited over the array of micro-LEDs 14 that are already integrated with the backplane circuitry. The first photo-curable fluid 30a can have a depth sufficient to completely fill the recesses 24 and can completely cover the top surface 22 of the array 12.

Figure 4A:
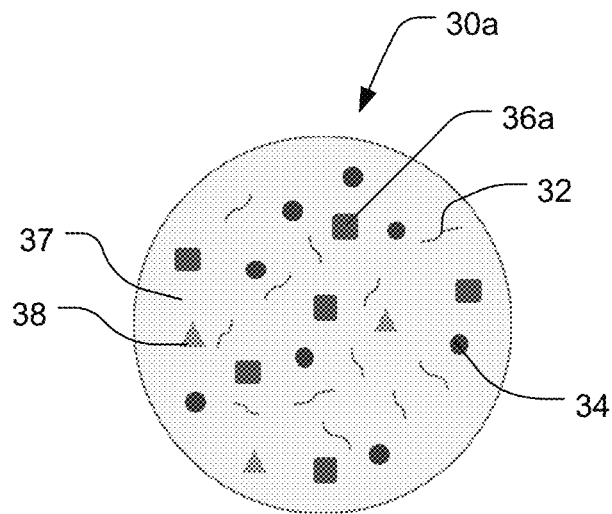
FIGS. 4A-4C illustrate formulations of photo-curable fluid.

Referring to FIG. 4A, the first photo-curable fluid 30a includes at least cross-linkable groups 32, a photo-initiator 34 to trigger polymerization under illumination of a wavelength corresponding to the emission of the micro-LEDs 14, and color conversion agents 36a.

The cross-linkable groups 32 will increase the viscosity of the fluid 30a when subjected to polymerization, e.g., the fluid 30a can be solidified or form gel-like network structures. The cross-linkable groups 32 can be provided by monomers that form a polymer when cured, e.g., acrylate, methacrylate and acrylamide. The cross-linkable groups 32 can be provided by a negative photoresist, e.g., SU-8 photoresist.

Examples of the photo-initiator 34 include Irgacure 184, Irgacure 819, Darocur 1173, Darocur 4265, Dacocur TPO, Omnicat 250 and Omnicat 550.

The color conversion agents 36a is a material that can convert the shorter wavelength light from the micro-LED 14 into longer wavelength light corresponding to one of the three colors. In the example illustrated by FIGS. 3A-3G, the color conversion agent 36 converts the UV light from the micro-LED 14 into blue light. The color conversion agent 36 can include quantum dots, nanostructures, organic or inorganic fluorescence molecules, or other suitable materials.

Optionally, the first photo-curable fluid 30a can include a solvent 37, e.g., water, ethanol, toluene or methylethylketone, or a combination thereof. The solvent can be organic or inorganic. The solvent can be selected to provide a desired surface tension and/or viscosity for the first photo-curable fluid 30a. The solvent can also improve chemical stability of the other components.

Optionally, the first photo-curable fluid 30a can include one or more other functional ingredients 38. As one example, the functional ingredients can affect the optical properties of the color conversion layer. For example, the functional ingredients can include nano-particles with a sufficiently high index of refraction that the color conversion layer functions as an optical layer that adjusts the optical path of the output light, e.g., provides a microlens. Alternately or in addition, the nano-particles can have an index of refraction selected such that the color conversion layer functions as an optical layer that reduces total reflection loss, thereby improving light extraction. As another example, the functional ingredients can be a surfactant to adjust the surface tension of the fluid 30a.

Returning to FIG. 3A, the first photo-curable fluid 30a can be deposited on the display over the micro-LED array by a spin-on, dipping, spray-on, or inkjet process. An inkjet process can be more efficient in consumption of the first photo-curable fluid 30a.

Figure 3B:
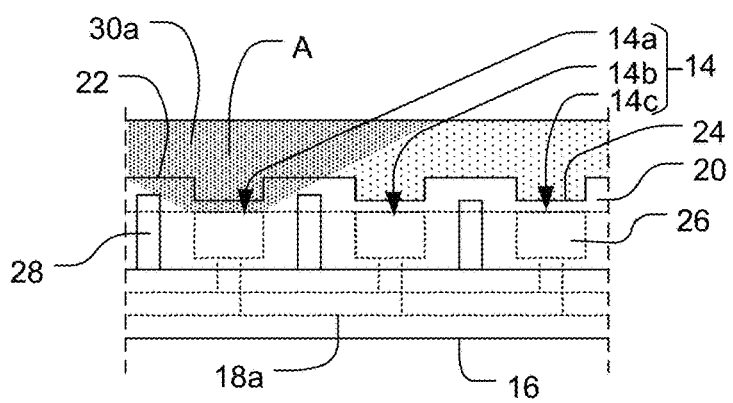

Next, as shown in FIG. 3B, the circuitry of the backplane 16 is used to selectively activate a first plurality of micro-LEDs 14a. This first plurality of micro-LEDs 14a correspond to the sub-pixels of a first color. In particular, the first plurality of micro-LEDs 14a correspond to the sub-pixels for the color of light to be generated by the color conversion components in the photo-curable fluid 30a. For example, assuming the color conversion component in the fluid 30a will convert light from the micro-LED 14 into blue light, then only those micro-LEDs 14a that correspond to blue sub-pixels are turned on. Because the micro-LED array is already integrated with the backplane circuitry 18, power can be supplied to the micro-LED display 10 and control signals can be applied by a microprocessor to selectively turn on the micro-LEDs 14a.

Figure 3C:
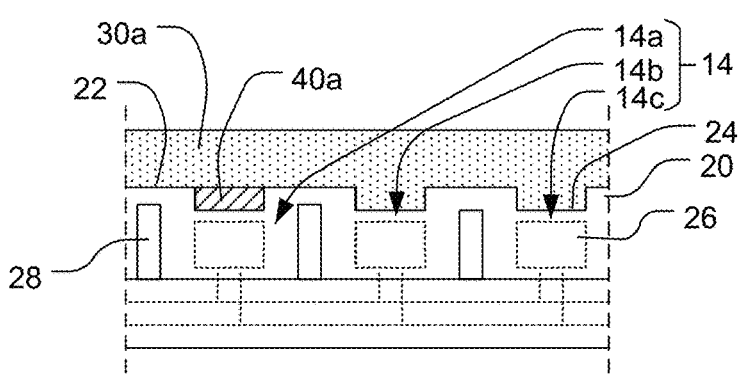

Referring to FIGS. 3B and 3C, activation of the first plurality of micro-LEDs 14a generates illumination A (see FIG. 3B) which causes in-situ curing of the first photo-curable fluid 30a to form a first solidified color conversion layer 40a (see FIG. 3C) over each activated micro-LED 14a. In short, the fluid 30a is cured to form color conversion layers 40a, but only over the selected micro-LEDs 14a. For example, a color conversion layer 40a for converting to blue light can be formed over each micro-LED 14a.

In particular, a first solidified color conversion layer 40a is formed in the recess 24 for each activated micro-LED 14a. Although FIG. 3C illustrates the top surface of the first color conversion layer 40a as being coplanar with the top surface 22 of the top layer 20, this is not necessary. For example, the top of the surface of the first color conversion layer 40a can be below the top surface 22. Alternatively, the first color conversion layer 40a can be thicker than the recess 24. In such a case, a portion of the first color conversion layer 40a can "overflow" onto portions of the top surface 22 adjacent the recess.

In some implementations, the curing is a self-limiting process. For example, illumination, e.g., UV illumination, from the micro-LEDs 14a can have a limited penetration depth into the photo-curable fluid 30a. As such, although FIG. 3B illustrates the illumination A reaching the surface of the photo-curable fluid 30a, this is not necessary. In some implementations, the illumination from the selected micro-LEDs 14a does not reach the other micro-LEDs 14b, 14c. In this circumstance, the isolation structures 28 may not be necessary.

However, if the spacing between the micro-LEDs 14 is sufficiently small, isolation structures 28 can affirmatively block illumination A from the selected micro-LED 14a from reaching the area over the other micro-LEDs that would be within the penetration depth of the illumination from those other micro-LEDs. In short, the isolation structures 28 can prevent a color conversion layer forming in the recess 24 over an adjacent micro-LED. Isolation structures 28 can also be included, e.g., simply as insurance against illumination reaching the area over the other micro-LEDs.

The driving current and drive time for the first plurality of micro-LEDs 14a can be selected to optimize photon dosage for the photo-curable fluid 30a. The power per subpixel for curing the fluid 30a is not necessarily the same as the power per subpixel in a display mode of the micro-LED display 10. For example, the power per subpixel for the curing mode can be higher than the power per subpixel for the display mode.

Figure 3D:
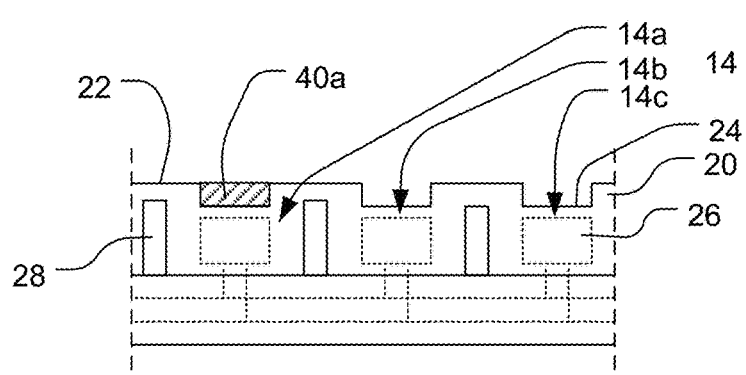

Referring to FIG. 3D, when curing is complete and the first solidified color conversion layer 40a is formed, the residual uncured first photo-curable fluid is removed from the display 10. This leaves the recesses 24 over the other micro-LEDs 14b, 14c, exposed for the next deposition steps. In some implementations, the uncured first photo-curable fluid 30a is simply rinsed from the display with a solvent, e.g., water, ethanol, toluene or methylethylketone, or a combination thereof. If the photo-curable fluid 30a includes a negative photoresist, then the rinsing fluid can include a photoresist developer for the photoresist.

Figure 3E:
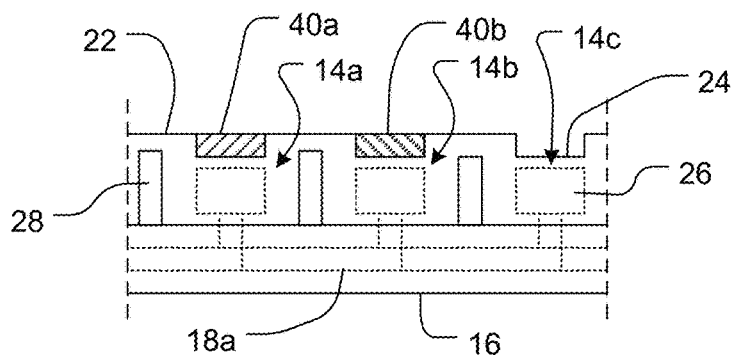
Figure 4B:
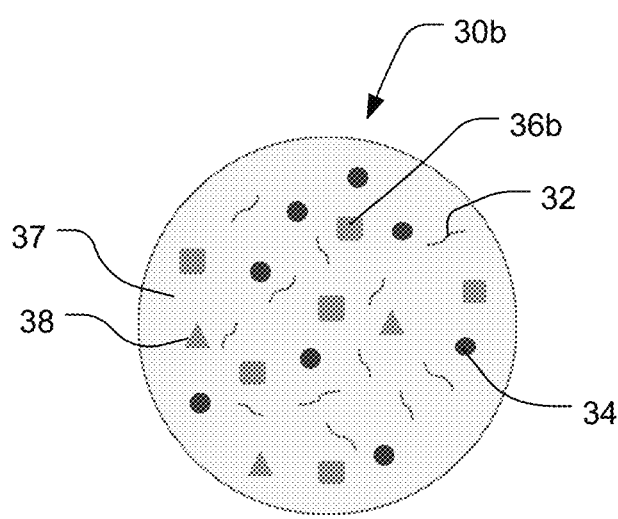

Referring to FIGS. 3E and 4B, the treatment described above with respect to FIGS. 3A-3D is repeated, but with a second photo-curable fluid 30b and activation of a second plurality of micro-LEDs 14b. After rinsing, a second color conversion layer 40b is formed in the recess 24 over each of the second plurality of micro-LEDs 14b. The top surface of the second color conversion layer 40b can be below the top surface 22 of the top layer 20, or a portion of the second color conversion layer 40b can "overflow" onto portions of the top surface 22 adjacent the recess 24.

The second photo-curable fluid 30b is similar to the first photo-curable fluid 30a, but includes color conversion agents 36b to convert the shorter wavelength light from the micro-LEDs 14 into longer wavelength light of a different second color. The second color can be, for example, green.

The second plurality of micro-LEDs 14b correspond to the sub-pixels of a second color. In particular, the second plurality of micro-LEDs 14b correspond to the sub-pixels for the color of light to be generated by the color conversion components in the second photo-curable fluid 30b. For example, assuming the color conversion component in the fluid 30a will convert light from the micro-LED 14 into green light, then only those micro-LEDs 14b that correspond to green sub-pixels are turned on.

Figure 3F:
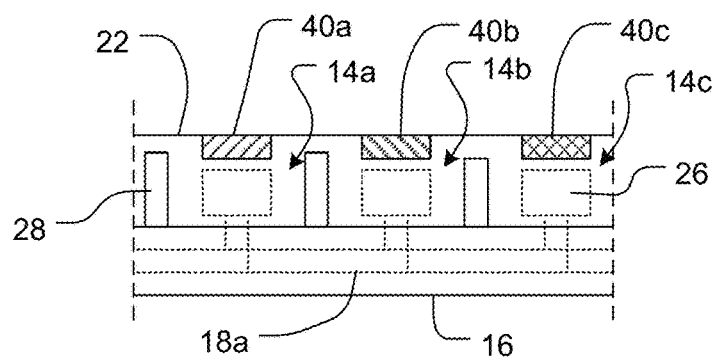
Figure 4C:
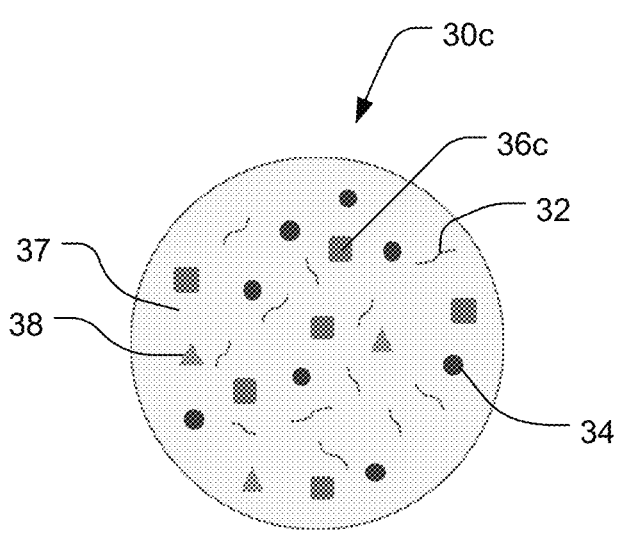

Referring to FIGS. 3F and 4C, optionally the treatment described above with respect to FIGS. 3A-3D is repeated yet again, but with a third photo-curable fluid 30c and activation of a third plurality of micro-LEDs 14c. After rinsing, a third color conversion layer 40c is formed in the recess 24 over each of the third plurality of micro-LEDs 14c. The top surface of the third color conversion layer 40c can be below the top surface 22 of the top layer 20, or a portion of the third color conversion layer 40c can "overflow" onto portions of the top surface 22 adjacent the recess 24.

The third photo-curable fluid 30c is similar to the first photo-curable fluid 30a, but includes color conversion agents 36c to convert the shorter wavelength light from the micro-LEDs 14 into longer wavelength light of a different third color. The third color can be, for example, red.

The third plurality of micro-LEDs 14c correspond to the sub-pixels of a third color. In particular, the third plurality of micro-LEDs 14c correspond to the sub-pixels for the color of light to be generated by the color conversion components in the third photo-curable fluid 30c. For example, assuming the color conversion component in the fluid 30c will convert light from the micro-LED 14 into red light, then only those micro-LEDs 14c that correspond to red sub-pixels are turned on.

In this specific example illustrated in FIGS. 3A-3F, color conversion layers 40a, 40b, 40c are deposited for each color sub-pixel. This is needed, e.g., when the micro-LEDs generate ultraviolet light.

However, the micro-LEDs 14 could generate blue light instead of UV light. In this case, the coating of the display 10 by a photo-curable fluid containing blue color conversion agents can be skipped, and the process can be performed using the photo-curable fluids for the green and red subpixels. One plurality of micro-LEDs is left without a color conversion layer, e.g., as shown in FIG. 3E. The process shown by FIG. 3F is not performed. For example, the first photo-curable fluid 30a could include green CCAs and the first plurality of micro-LEDs 14a could correspond to the green subpixels, and the second photo-curable fluid 30b could include red CCAs and the second plurality of micro-LEDs 14b could correspond to the red subpixels.

Figure 3G:
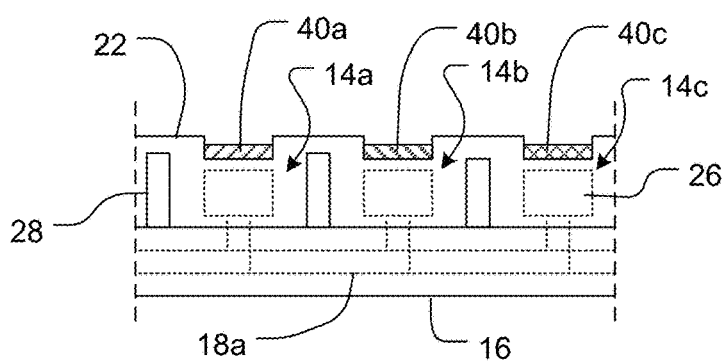

Assuming that the fluids 30a, 30b, 30c included a solvent, some solvent may be trapped in the color conversion layers 40a, 40b, 40c. Referring to FIG. 3G, this solvent can be evaporated, e.g., by exposing the micro-LED array to heat, such as by IR lamps. Evaporation of the solvent from the color conversion layers 40a, 40b, 40c can result in shrinking of the layers so that the final layers are thinner.

Removal of the solvent and shrinking of the color conversion layers 40a, 40b, 40c can increase concentration of color conversion agents, e.g., quantum dots, thus providing higher color conversion efficiency. On the other hand, including a solvent permits more flexibility in the chemical formulation of the other components of the photo-curable fluids, e.g., in the color conversion agents or cross-linkable components.

Figure 3H:
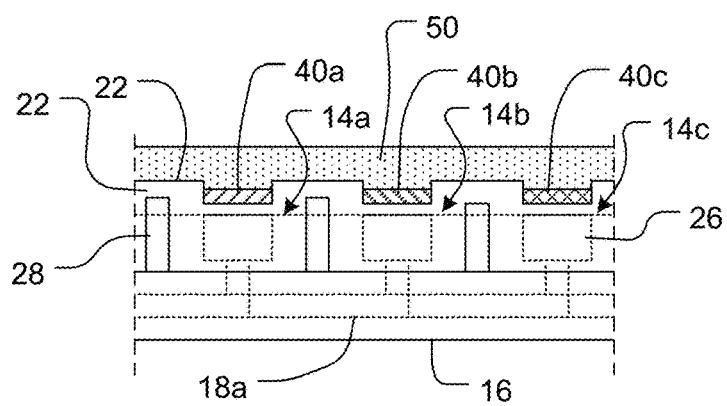

Optionally, as shown in FIG. 3H, a UV blocking layer 50 can be deposited over the top layer 20 so as to cover all of the micro-LEDs 14. The UV blocking layer 50 can block UV light that is not absorbed by the color conversion layers 40. The UV blocking layer 50 can be a Bragg reflector, or can simply be a material that is selectively absorptive to UV light. A Bragg reflector can reflect UV light back toward the micro-LEDs 14, thus increasing energy efficiency.

FIGS. 5A-5E illustrate a method of fabricating a micro-LED array that has recesses in a top layer. Referring to FIG. 5A, the process starts with the wafer 100 that will provide the micro-LED array. The wafer 100 includes a substrate 102, e.g., a silicon or sapphire wafer, on which are disposed a first semiconductor layer 104 having a first doping, an active layer 106, and a second semiconductor layer 108 having a second opposite doping. For example, the first semiconductor layer 104 can be an n-doped gallium nitride (n-GaN) layer, the active layer 106 can be a multiple quantum well (MQW) layer 106, and the second semiconductor layer 108 can be an p-doped gallium nitride (p-GaN) layer.

Referring to FIGS. 5B and 6, the wafer 100 is etched to divide the first semiconductor layer 104, the active layer 106, and the second semiconductor layer 108 into diode structures 26 that will provide the micro-LEDs 14, including the first, second and third plurality of micro-LEDs 14a, 14b, 14c that correspond to the first, second and third colors. Each diode structure 26 includes at least a portion of the first semiconductor layer 104, the active layer 106, and at least a portion of the second semiconductor layer 108.

The etching extends entirely through the second semiconductor layer 108 and the active layer 106. However, the etching extends partially, but not entirely, through the first semiconductor layer 104. This provides one or more recessed regions 112 around each diode structures 26 in the surface of the first semiconductor layer 104 that is closer to the active layer 106. In addition, the diode structures 26 remain physically connected by interstitial regions 114 of the first semiconductor layer 104.

In addition, conductive contacts 110 can be deposited. For example, a first contact 110a can be deposited on the second semiconductor layer 108, and a second contact 110b can be deposited on the first semiconductor layer 104. For example, the second contact 110b can be deposited in the recess 112 on the interstitial region 114 of the first semiconductor layer 104. For example, the first contact 110a can be a p-contact and the second contact 110b can be an n-contact deposited onto a p-GaN layer and a n-GaN, respectively.

Due to the recess 112, the second contact 110b can extend along an entire depth of the diode structure 26. In addition, the second contact 110b can form a rectangular grid with each first contact 110a positioned in an aperture defined by the gaps between walls of the second contact 110b.

The backplane 16 is fabricated to include the circuitry 18, as well as electrical contacts 120. The electrical contacts 120 can include first contacts 120a, e.g., drive contacts, and second contacts 120b, e.g., ground contacts.

Referring to FIG. 5C, the micro-LED wafer 100 is aligned and placed in contact with the backplane 16. For example, the first contacts 110a can contact the first contacts 120a, and the second contacts 110b can contact the second contacts 120b. The micro-LED wafer 100 could be lowered into contact with the backplane, or vice-versa.

Next, referring to FIG. 5D, the substrate 102 is removed. For example, a silicon substrate can be removed by polishing away the substrate 102, e.g., by chemical mechanical polishing. As another example, a sapphire substrate can be removed by a laser liftoff process.

Finally, referring to FIGS. 5E and 6, the recesses 24 are formed in, e.g., etched into, the surface 22 of the first semiconductor layer 104 on the side of the layer 104 farther from the active layer 106. Thus, the first semiconductor layer 104 can provide the top layer 20 of the assembly. Each recess 24 is positioned above a respective one of the micro-LEDs 14, e.g., above the diode structure 26.

The recesses 24 can be formed by a conventional process such as deposition of photoresist over the top layer 20, patterning of the photoresist by photolithography, developing of portions of the photoresist to expose portions of the surface 22 of the underlying top layer 20, etching the exposed portions of the top layer to form the recesses, and stripping the photoresist. The resulting structure can then be used as the display 10 for the processed described for FIGS. 3A-3G.

Terms of positioning, such as vertical and lateral, have been used. However, it should be understood that such terms refer to relative positioning, not absolute positioning with respect to gravity. For example, laterally is a direction parallel to a substrate surface, whereas vertically is a direction normal to the substrate surface.

It will be appreciated to those skilled in the art that the preceding examples are exemplary and not limiting. For example:
Although the above description focuses on micro-LEDs, the techniques can be applied to other displays with other types of light emitting diodes, particularly displays with other micro-scale light emitting diodes.
Although the above description assumes that the order in which the color conversion layers are formed is blue, then green, then red, other orders are possible. For example, blue, then red, then green. In addition, other colors are possible, e.g., orange and yellow.
Instead of the first semiconductor layer providing the top layer with the recesses, one or more other layers can be disposed over the first semiconductor layer with an uppermost of these other layers providing the top layer with the recesses.

It will be understood that various modifications may be made without departing from the spirit and scope of the present disclosure.

What is claimed is:

1. A method of fabricating a multi-color display, comprising:
dispensing a first photo-curable fluid over a display having an array of light emitting diodes disposed below a cover layer that spans the array of light emitting diodes and has an outer surface with a plurality of recesses that extend partially but not entirely through the cover layer such that the first photo-curable fluid fills the recesses, wherein each light emitting diode has a corresponding recess, the light emitting diodes are electrically integrated with backplane circuitry of a backplane, and the first photo-curable fluid includes a first color conversion agent;
activating a first plurality of light emitting diodes in the array of light emitting diodes to illuminate and cure the first photo-curable fluid to form a first color conversion layer in a first plurality of recesses over the first plurality of light emitting diodes to convert light from the first plurality of light emitting diodes to light of a first color;
removing an uncured remainder of the first photo-curable fluid;
thereafter dispensing a second photo-curable fluid over the display such that the second photo-curable fluid fills recesses of the plurality of recesses that are not filled by the first color conversion layer, the second photo-curable fluid including a second color conversion agent, wherein at least one of the first photo-curable fluid and the second photo-curable fluid includes a solvent;

activating a second plurality of light emitting diodes in the array of light emitting diodes to illuminate and cure the second photo-curable fluid to form a second color conversion layer in a second plurality of recesses over the second plurality of light emitting diodes to convert light from the second plurality of light emitting diodes to light of a different second color;

removing an uncured remainder of the second photo-curable fluid; and after curing of the said at least one of the first photo-curable fluid and second photo-curable fluid, evaporating the solvent.

2. The method of claim 1, further comprising:

dispensing a third photo-curable fluid over the display such that the third photo-curable fluid fills recesses of the plurality of recesses that are not filled by the first color conversion layer and the second color conversion layer, wherein the third photo-curable fluid includes a third color conversion agent;

activating a third plurality of light emitting diodes in the array of light emitting diodes to illuminate and cure the third photo-curable fluid to form a third color conversion layer in a third plurality of recesses over the third plurality of light emitting diodes to convert light from the third plurality of light emitting diodes to light of a different third color; and removing an uncured remainder of the third photo-curable fluid.

3. The method of claim 2, wherein the first color, second color and third color are selected from blue, green and red.

4. The method of claim 2, wherein light emitting diodes of the array of light emitting diodes are configured to generate ultraviolet light.

5. The method of claim 1, wherein the array of light emitting diodes include a third plurality of light emitting diodes, and no color conversion layer is formed over the third plurality of light emitting diodes.

6. The method of claim 1, wherein activating the first plurality of light emitting diodes cures the first photo-curable fluid to form the first color conversion layer with a top surface below the outer surface of the cover layer.

7. The method of claim 1, wherein activating the first plurality of light emitting diodes cures the first photo-curable fluid to form the first color conversion layer such that the first color conversion layer overflows the recess.

8. The method of claim 1, wherein each of the light emitting diodes comprises a diode structure including a first semiconductor layer having a first doping, a second semiconductor layer having a second opposite doping, and an active layer between the first semiconductor layer and the second semiconductor layer.

9. The method of claim 8, wherein the light emitting diodes comprise micro-LEDs, the first semiconductor layer is an n-GaN layer, and the second semiconductor layer is a p-GaN layer.

10. The method of claim 8, wherein the second semiconductor layer provides the cover layer and the plurality of recesses are formed in a surface of the second semiconductor layer farther from the active layer.

11. The method of claim 8, wherein a plurality of optical isolation structures are formed on the backplane between adjacent light emitting diodes of the array of light emitting diodes and below the cover layer.

12. The method of claim 11, wherein during activation of the first plurality of light emitting diodes, the optical isolation structures block illumination from the first plurality of light emitting diodes from reaching the second plurality of light emitting diodes.

13. The method of claim 11, wherein the optical isolation structures are conductive.

14. The method of claim 13, wherein the optical isolation structures comprise conductive pads to connect the light emitting diodes to the backplane circuitry.

15. The method of claim 1, comprising forming an ultraviolet blocking layer over the array of light emitting diodes.

16. The method of claim 1, wherein removing the uncured remainder of the first photo-curable fluid leaves the first color conversion layer in the first plurality of recesses with a top surface no higher than the outer surface of the cover layer.

17. The method of claim 1, wherein evaporating the solvent results in the said at least one of the first color conversion layer and second color conversion layer with a top surface below the outer surface of the cover layer.

* * * * *